(12) United States Patent
Tan et al.

(10) Patent No.: US 8,314,439 B2
(45) Date of Patent: Nov. 20, 2012

(54) LIGHT EMITTING DIODE WITH NANOSTRUCTURES AND METHOD OF MAKING THE SAME

(75) Inventors: Wei-Sin Tan, Oxford (GB); Alistair Paul Curd, High Wyncombe (GB); Valerie Berryman-Bousquet, Chipping Norton (GB)

(73) Assignee: Sharp Kabushiki Kaisha, Osaka (JP)

( * ) Notice: Subject to any disclaimer, the term of this patent is extended or adjusted under 35 U.S.C. 154(b) by 159 days.

(21) Appl. No.: 13/025,265

(22) Filed: Feb. 11, 2011

(65) Prior Publication Data

US 2012/0205692 A1 Aug. 16, 2012

(51) Int. Cl.
*H01L 33/06* (2010.01)
*H01L 21/00* (2006.01)

(52) U.S. Cl. ............... 257/98; 257/E33.067; 438/34

(58) Field of Classification Search ............ 257/13, 257/79–103, 918, E51.018, E51.019, E51.02, 257/E51.021, E51.022, E33.054, E25.028, 257/E33.001, E33.011, E33.067; 438/34, 438/69

See application file for complete search history.

(56) References Cited

U.S. PATENT DOCUMENTS

| 5,955,749 | A | 9/1999 | Joannopoulos et al. |
| 6,091,085 | A | 7/2000 | Lester |
| 7,244,957 | B2 | 7/2007 | Nakajo et al. |
| 7,947,972 | B2 * | 5/2011 | Moon .................. 257/13 |
| 2008/0279242 | A1 | 11/2008 | Bour |
| 2010/0059779 | A1 | 3/2010 | Chen et al. |

OTHER PUBLICATIONS

Yamada et al., "InGaN-Based Near-Ultraviolet and Blue-Light-Emitting Diodes with High External Quantum Efficiency Using a Patterned Sapphire Substrate and a Mesh Electrode", Japanese Journal of Applied Physics, vol. 41, L1431-1433, 2002 (cited on p. 2, line 4 of the specification).
Matioli et al., "High extraction efficiency light-emitting diodes based on embedded air-gap photonic-crystals", Applied Physics Letters, vol. 96, pp. 031108, 2010 (cited on p. 2, line 8 of the specification).
Horng et al., "GaN-based light-emitting diodes with indium tin oxide texturing window layers using natural lithography", Applied Physics Letters, vol. 86, 221101, 2005 (cited on p. 2, line 11 of the specification).
Min-Ho Kim, "Origin of efficiency droop in GaN-based light-emitting diodes", Applied Physics Letters 91, 183507, 2007.

* cited by examiner

*Primary Examiner* — Benjamin Sandvik
*Assistant Examiner* — Selim Ahmed
(74) *Attorney, Agent, or Firm* — Renner, Otto, Boisselle & Sklar, LLP (57) ABSTRACT

A light emitting diode (LED) is provided along with a method of making the same. The LED includes a conductive n-type region formed on a substrate; an active region formed on the n-type region; a first p-type region formed on the active region; a plurality of nanostructures formed on the first p-type region to carry out light extraction from the active region, the nanostructures having a diameter less than 500 nm; a second p-type region regrown on the first p-type region to form a non-planar surface in combination with the nanostructures; and a p-type electrode formed on the non-planar surface.

22 Claims, 7 Drawing Sheets

LIGHT EMITTING DIODE WITH NANOSTRUCTURES AND METHOD OF MAKING THE SAME

TECHNICAL FIELD OF THE INVENTION

The present invention relates to a light emitting diode (LED) device and a method of making the same, and in particular an LED device structure with periodic nanostructures and regrown p-type region to increase contact area for higher light extraction efficiency and lower p-electrode ohmic contact resistance.

BACKGROUND OF THE INVENTION

The inception of high quality gallium-nitride based crystal growth has led to growing popularity in the use of light emitting diodes (LED) in general lighting and backlighting applications to replace conventional light sources such as incandescent bulbs, halogen bulbs, cold cathode fluorescent lamps (CCFL) and compact fluorescent lamps (CFL). For these applications, indium gallium nitride-based blue LED chips emitting at ~450 nm is typically used to excite a phosphor layer to create white light. Although rapid progress has been made over the past 10 years in the optimizing of gallium nitride growth and device structure, p-electrode ohmic contact resistance and light extraction efficiency (LEE) remain the major obstacles in limiting the performance of these devices. Reducing the p-electrode contact resistance is intrinsically difficult due to the wide bandgap nature (3.4 eV) and low hole mobility ($\mu_H$~10 cm$^2$/Vs) of gallium nitride. The contact resistance is governed by the quality of the contact between the metal electrode and semiconductor interface, and also the contact area. For small LED chip manufacturers, p-electrode contact resistance is particularly problematic, since the LED chip size is typically only ~200×600 um and high contact resistance is a major limitation to the wall plug efficiency of the device.

Due to the large refractive index contrast between gallium nitride (n~2.5) and air, much of the light generated in the active region is confined and waveguided within the semiconductor layers, thus unable to escape to air. As a result, the waveguided light is eventually absorbed, leading to poor LEE. The light extraction efficiency for a conventional planar LED chip is typically only ~25-30%. A variety of methods has been employed to increase LEE, such as surface roughening, photonic crystals, flip-chip, chip shaping, and patterned sapphire substrates. The use of patterned sapphire substrates as extraction features is a common method to improve LEE in commercial blue LED chips, which leads to LEE values of ~60% (Yamada et. al, Japanese Journal of Applied Physics, vol. 41, L1431-1433, (2002)). However, growth on patterned sapphire substrates is not easy, and uniformity is particularly problematic on larger wafers (e.g., 6 inch).

In general, the extraction features are preferably placed as close as possible to the active region in order to achieve the best LEE. Matioli et. al [Applied Physics Letters, vol. 96, pp. 031108 (2010)] employed embedded air-gap photonic crystal structures and achieved an extraction efficiency of ~73% when un-encapsulated and 94% when encapsulated.

Horng et. al [Applied Physics Letters, vol. 86, 221101 (2005)] reported the use of a roughened ITO layer to increase LEE, but the extraction features are positioned far away (~500 nm) from the active region, reducing light extraction efficiency. Furthermore, roughened surfaces are usually difficult to control in volume manufacturing.

Figure 1:
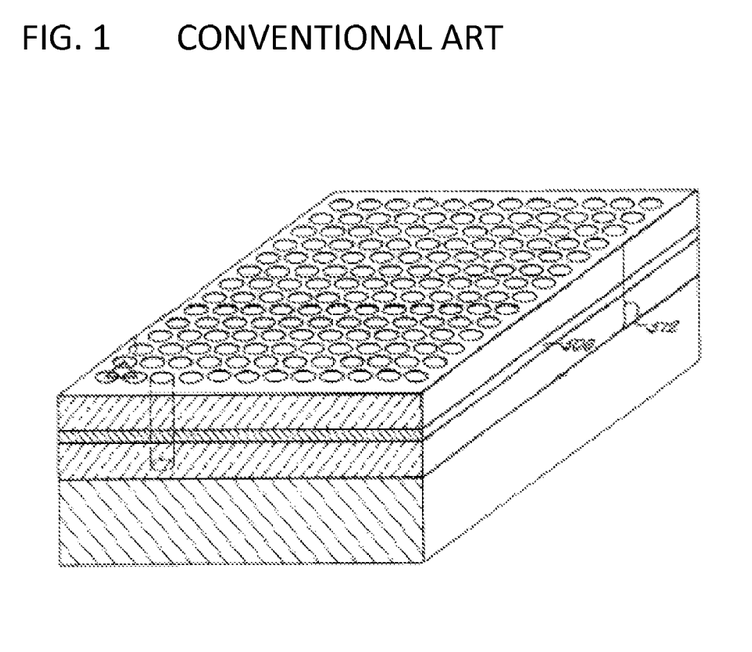
FIG. 1 is a known LED structure with holes formed in the p-type region.

FIG. 1 is the schematic diagram of a two dimensional periodic variation of dielectric constant structure 512 used to increase LEE as described by U.S. Pat. No. 5,955,749 (J. Joannopoulos et al., issued 21 Sep. 1999). In the example given, the periodic structures 512 are formed in the p-type GaAs 506 layer by etching to improve LEE. While this structure leads to improved LEE, it also results in increased lateral current spreading resistance and p-electrode ohmic contact resistance due to etch damage to the p-layer induced by the dry-etching process.

Figure 2:
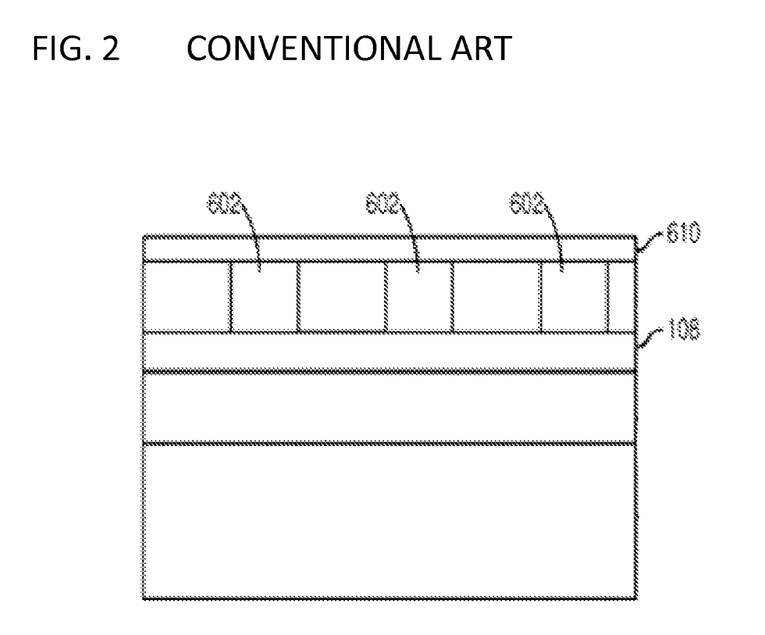
FIG. 2 is a known LED structure with embedded features.

FIG. 2 is an embodiment of an LED device structure described in US 2010/0059779 A1 (D. Chen et al., published 11 Mar. 2010). Dielectric layers 602 are embedded within the active region 108 vicinity to improve LEE. The p-type layer 610 is regrown over the embedded dielectric layers 602 to planarise the surface. While LEE can be improved with this structure, the p-contact resistance will remain high as the p-electrode contact area is the same as a conventional planar LED.

Figure 3:
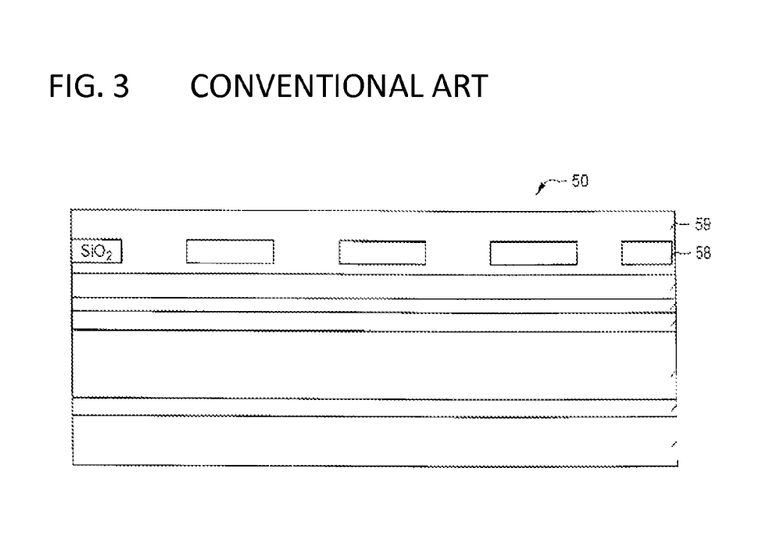
FIG. 3 is another known LED structure with embedded structures.

FIG. 3 shows an LED device structure 50 disclosed in US 2008/0279242 A1 (D. Bour, published 13 Nov. 2008). A regrowth method is used to embed SiO$_2$ structures 58 within the p-GaN region 59. The final device structure is planarised. Similar to the previous example, the p-contact resistance will remain high since the contact area is similar to conventional planar LEDs.

Figure 4:
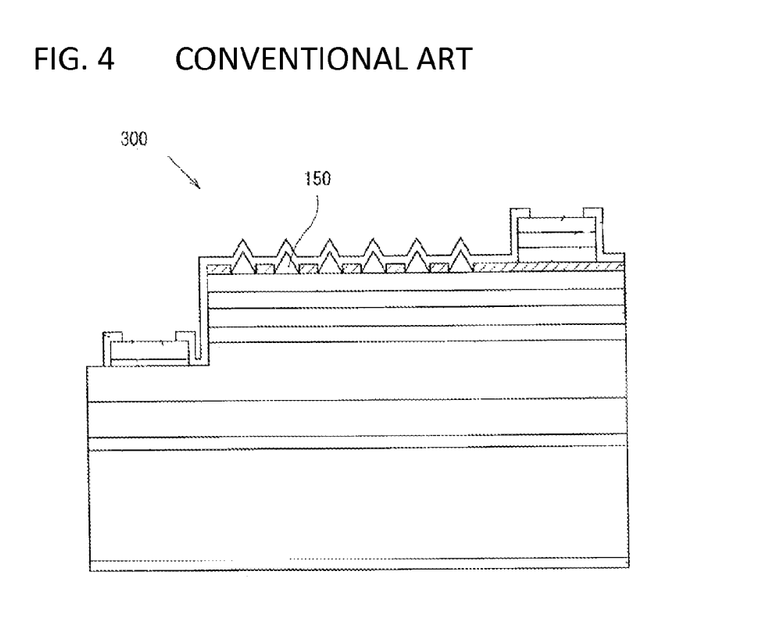
FIG. 4 is a known LED bulb with LEDs mounted in a conformal manner.

FIG. 4 is an LED device structure 300 disclosed in U.S. Pat. No. 7,244,957 B2 (N. Nakajo et al., issued 17 Jul. 2007). A micrometer-scale light projection region 150 consisting of GaN material is formed on the p-surface either by etching through ITO layer or by patterning SiO$_2$ layers, to improve light extraction efficiency. Current spreading may be an issue with micrometer-scale structures and the light extraction features are placed further away from the active region, therefore reducing its effectiveness.

Figure 5:
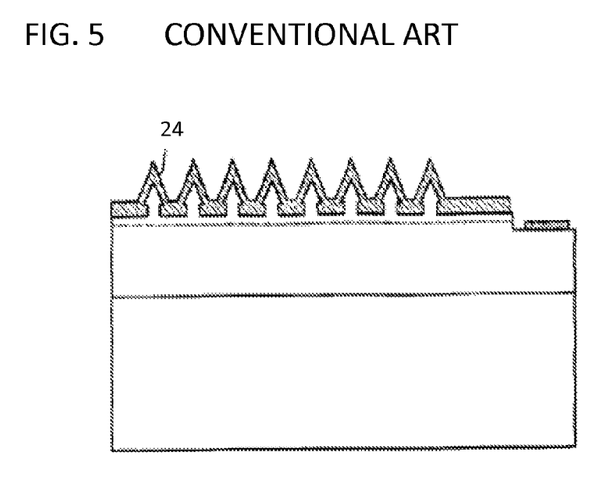
FIG. 5 is another known LED device designed to emit light sideways.

FIG. 5 depicts an embodiment of an LED device disclosed in U.S. Pat. No. 6,091,085 (S. Lester, issued 18 Jul. 2000). Using conventional lithography techniques, GaN is regrown on patterned SiO$_2$ layers to form light projection regions 24 as means to increase light extraction efficiency.

Thus, there is a need in the art for LED devices for good light extraction efficiency, but also to improve the p-electrode contact resistance. An object of the present invention is to provide an LED with good light extraction efficiency, and simultaneously increasing the p-electrode contact area, thereby improving ohmic contact resistance. Both these features are key towards realization of high efficiency nitride LEDs.

SUMMARY OF THE INVENTION

The present invention provides an LED device structure with good light extraction and increased electrode area for reducing contact resistance. The invention includes a regrown p-GaN region over a periodic nano-patterned surface. The regrowth process is performed such that the surface is not planarised, thus giving rise to an increase in p-electrode contact area.

An aspect of the invention is for the LED structure to consist of nanostructures, preferably less than 500 nm in diameter. These dimensions are chosen such that current spreading can occur beneath the nanostructures. If current spreading does not occur beneath the nanostructures, the active LED area is essentially decreased, leading to increased current density at a particular drive current, and the LED efficiency is reduced due to 'efficiency droop' effect (see, e.g., Applied Physics Letters, vol 91, no. 18, pp. 183507) in nitride blue LEDs. A regrowth step is then performed on the nanostructured surface, such that the surface is not planarised but allowing for gaps/voids to be formed in order to increase the surface contact area for p-electrode. By "regrown" or "regrowth" as used to herein, it is meant that a p-type region is grown on an underlying p-type region on which the nanostructures are formed, while preferably only partially covering the nanostructures.

In one aspect of the invention, the regrowth step is performed by metal organic chemical vapour deposition (MOCVD), using lateral overgrowth techniques such as epitaxial lateral overgrowth (ELOG).

In another aspect of the invention, the regrowth step is performed by molecular beam epitaxy, and this method will result in single crystal material being formed on areas without nanostructures, and amorphous material formed on areas with nanostructures.

According to another aspect of the invention, metallic layers such as Ag, Al or Au are formed on top of the periodic nanostructures, as means to improve light extraction using plasmonic effects.

According to another aspect of the invention, a light emitting diode (LED is provided which includes a conductive n-type region formed on a substrate; an active region formed on the n-type region; a first p-type region formed on the active region; a plurality of nanostructures formed on the first p-type region to carry out light extraction from the active region, the nanostructures having a diameter less than 500 nm; a second p-type region regrown on the first p-type region to form a non-planar surface in combination with the nanostructures; and a p-type electrode formed on the non-planar surface.

According to another aspect, the second p-type region includes raised sidewalls adjacent the nanostructures.

In accordance with another aspect, the sidewalls include lateral overgrowth regions extending partially across an upper surface of the nanostructures.

According to another aspect, a shape of the nanostructures is at least one of a square, circle, triangle or combination thereof.

In accordance with still another aspect, the LED further includes a metallic layer formed above each of the nanostructures to achieve plasmonic effects.

According to yet another aspect, the nanostructures have a diameter less than 400 nm.

According to another aspect, the nanostructures have a diameter less than 300 nm.

According to still another aspect, the first p-type region has a thickness between 10 nm and 80 nm.

In accordance with another aspect, the nanostructures have a height between 10 nm and 100 nm.

According to another aspect, the nanostructures are formed of dielectric material.

In accordance with another aspect, the dielectric material is any one or more of $SiO_2$, $SiN_x$, $TiO_2$, ZnO, MgO, ScO and SrF.

According to another aspect, the p-type electrode is made of indium tin oxide.

In accordance with still another aspect, the p-type electrode is formed of one or more of Ni, Ti, Au, Ag, Pt, Hf, Pd, and Al.

In still another aspect, the metallic layer is made of one or more of Ag, Au and Al.

According to another aspect, the metallic layer is sandwiched between two layers forming each nanostructure.

According to another aspect, a method of making a light emitting diode (LED) is provided. The method includes forming a conductive n-type region on a substrate; forming an active region on the n-type region; forming a first p-type region on the active region; forming a plurality of nanostructures on the first p-type region to carry out light extraction from the active region, the nanostructures having a diameter less than 500 nm; regrowing a second p-type region on the first p-type region to form a non-planar surface in combination with the nanostructures; and forming a p-type electrode on the non-planar surface.

According to still another aspect, the nanostructures are patterned on the first p-type region.

According to yet another aspect, the second p-type region is regrown using metal organic chemical vapour deposition (MOCVD).

In still another aspect, the MOCVD includes the use of epitaxial lateral overgrowth technique (ELOG) to provide lateral overgrowth extending partially across an upper surface of the nano structures.

According to yet another aspect, the second p-type region is regrown using molecular beam epitaxy.

In accordance with another aspect, the method includes forming a metallic layer above each of the nanostructures to achieve plasmonic effects.

With yet another aspect, the metallic layer is sandwiched between two layers forming each nanostructure.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, like references indicate like parts or features.

DETAILED DESCRIPTION OF THE INVENTION

The present invention provides an LED device with good optical extraction efficiency and larger contact area for reducing p-electrode ohmic contact resistance. The LED structure includes periodic nanostructures formed in close vicinity of the active region, and a regrown p-type region over the nanostructures. The regrown p-type region is formed in such a way that the surface of the p-type region in combination with the nanostructures is not completely planarised, which enables larger contact area for the p-electrode by means of contacting the sidewall regions. The invention will be detailed through the description of embodiments, wherein like reference numerals are used to refer to like elements throughout.

Figure 6:
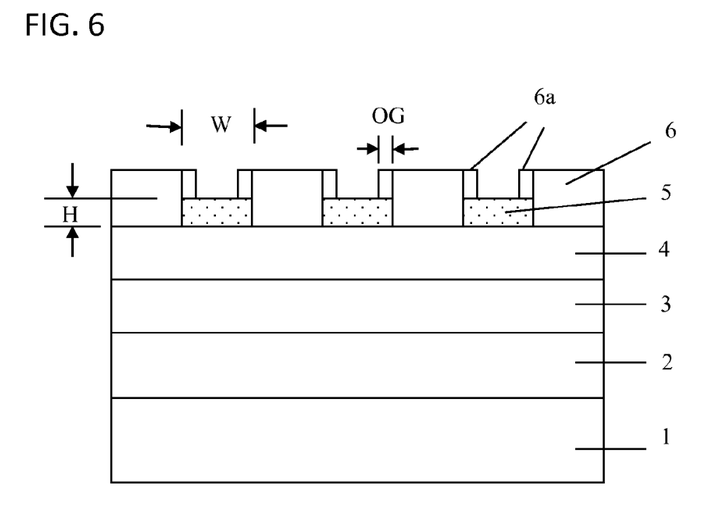
FIG. 6 is a general schematic diagram of an LED device structure in accordance with the invention.
Figure 7:
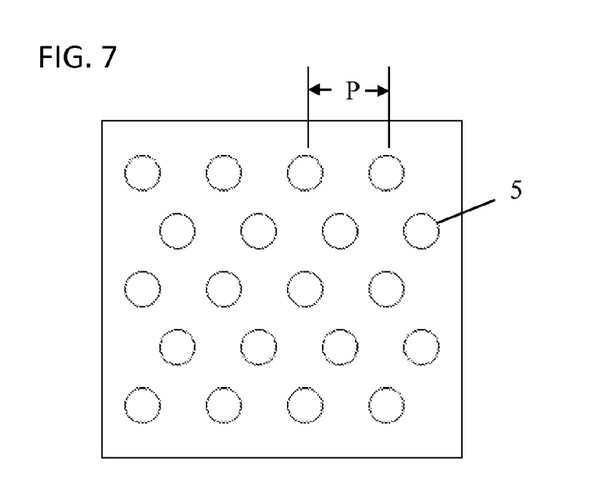
FIG. 7 is a schematic top view of the nanostructures formed on the LED of FIG. 6.

According to the invention, an LED with good light extraction efficiency and p-electrode resistance may be obtained. As illustrated in FIG. 6, the LED structure includes a substrate 1, a conductive n-type region 2, an active region 3, a first conductive p-type region 4, nanostructures 5 formed on the first p-type region 4, and a second conductive p-type region 6. The first p-type region 4 is preferably a layer grown thin to a thickness between 10 nm-80 nm. The lateral dimension(s) or width(s) W of the nanostructures 5, also referred to herein as the diameter(s) of the nanostructures 5, are preferably <500 nm, as this is to enable current spreading to flow directly beneath the nanostructures 5 on the p-type region 4. The diameter of the nanostructures is more preferably less than 400 nm and even more preferably less than 300 nm. The nanostructures 5 can take any particular shape and arrangement, such as squares, circles, triangles, etc., or any combination of these shaped structures, and are preferably arranged in any of various types of periodic arrays, although the nanostructures 5 may instead be randomly arranged, etc. For example, FIG. 7 depicts the top view of the LED structure of FIG. 6 an embodiment which utilizes circular shaped nanostructure 5. The height(s) H of the nanostructures 5 is preferably between 10 nm-100 nm, but can be larger, and the nanostructures 5 can be made of $SiO_2$, $SiN_x$, $TiO_2$, ZnO, MgO, ScO, SrF, or any other dielectric material or combination thereof. The thin first p-type region 4, is to allow the nanostructures 5 to be placed close to the active region 3 to enable good light extraction. The second p-type region 6 is to enable a metal electrode (not shown) to make contact to the p-type region 6.

Embodiment 1

Figure 8A:
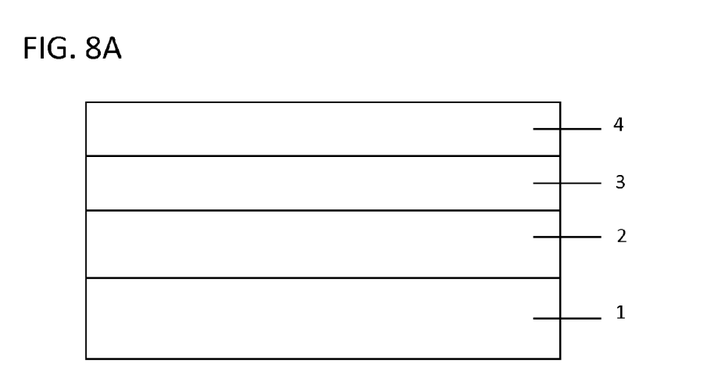
FIGS. 8A through 8F are schematic diagrams of an example of the LED device structure construction according to Embodiment 1 of the invention.
Figure 8B:
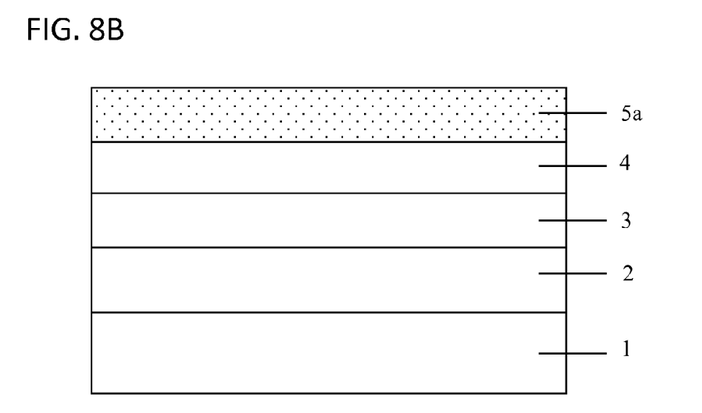
Figure 8C:
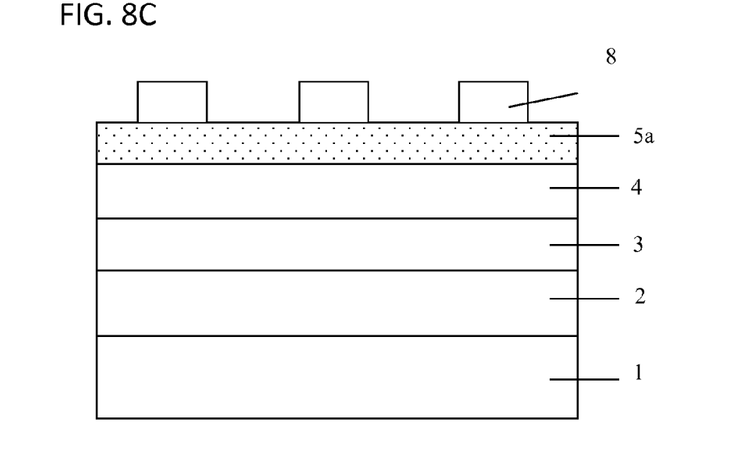
Figure 8D:
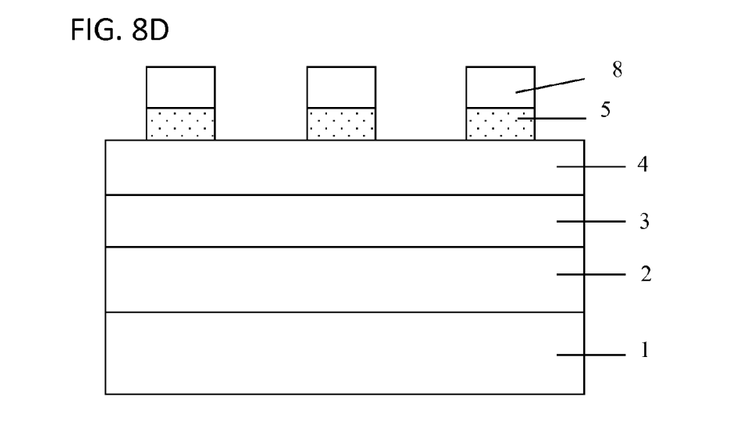
Figure 8E:
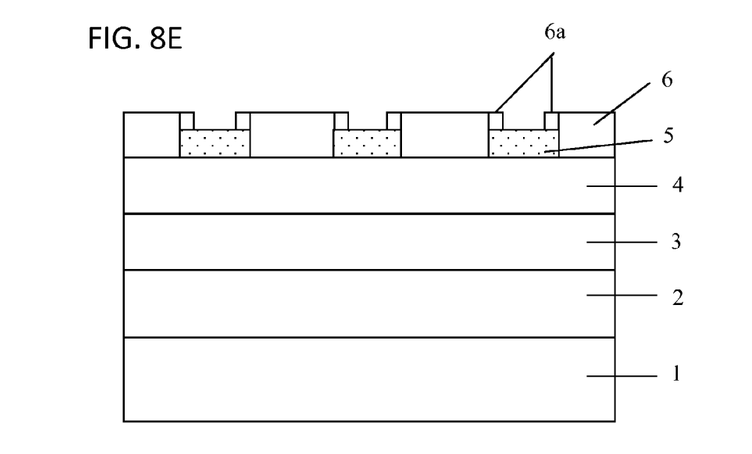

A first particular embodiment of an LED device in accordance with the present invention is as illustrated in FIG. 6. The LED device includes nanostructures consisting of dielectric material 5 and a regrown second p-type region 6 to complete the structure. The n-type region 2, active region 3 and first p-type region 4 are grown in order on the substrate 1 using metal-organic-chemical-vapour-deposition (MOCVD), for example. FIG. 8A is a schematic diagram of the device construction at this stage. The next step is to form the nanostructures 5 on the first p-type region 4. As an example, a silicon oxide layer 5a is first deposited on the nitride (e.g., GaN) first p-type region 4 using plasma enhanced chemical vapour deposition (PECVD), as illustrated in FIG. 8B. In FIG. 8C, a masking layer 8 is then formed on the silicon oxide layer 5a and patterned to define the nanostructures. A variety of known methods can be used to create the masking layer 8, such as nanoimprint lithography, stepper lithography, interference lithography, immersion lithography, electron-beam lithography, extreme UV lithography and/or by other means. A wet or dry etch is then employed to pattern the nanostructures 5 in what was the silicon oxide layer 5a as represented in FIG. 8D. The masking layer 8 is then removed. According to this embodiment, the second p-type region 6 is then regrown over the structure by MOCVD. During MOCVD growth, the nitride layer made of GaN which forms the second p-type region 6 will not epitaxially form on the remaining silicon oxide layer 5a making up the nanostructures 5, but will only do so on regions without $SiO_2$. This is due to the non-crystalline property of $SiO_2$ material. However by adjusting the growth condition of this GaN layer during MOCVD it is possible to form GaN by extending the lateral growth over the $SiO_2$ layer. This is called lateral epitaxy overgrowth process and is well known in the art. In a preferred embodiment, the second p-type region 6 is grown to a thickness which exceeds the height of the nanostructures 5 so as to create raised sidewalls adjacent the nanostructures 5. These sidewalls result in a larger contact area to the p-type region 6 than if second p-type region 6 and nanostructures 5 were to be planarised. However, use of the epitaxial lateral overgrowth technique (ELOG) inherent to MOCVD also allows lateral overgrowth to occur across the silicon oxide layer, forming regions 6a as shown in FIG. 8E. These overgrowth regions 6a extend partially across the upper surface of the nanostructures 5 which subsequently results in an even larger contact area to the p-type region 6 than without the lateral growth.

Figure 8F:
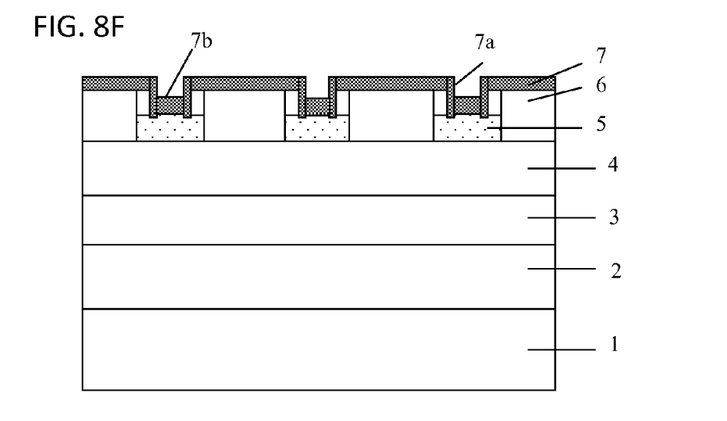

A p-electrode 7, which is typically indium tin oxide (ITO), but can also be made of one or more other metallic layers such as Ni, Ti, Au, Ag, Pt, Hf, Pd, or Al, is then formed over the structure of FIG. 8E, and an increased contact area is obtained through sidewall contacting areas 7a as shown in FIG. 8F. The electrode 7 is preferably deposited using a sputter coating system to ensure good conformal sidewall coverage. In contrast, conventional art structures with planarised surface such as the example given in FIG. 2 will have a smaller contact area. Based on an assumption of a specific p-contact resistivity of $6 \times 10^{-3} \Omega cm^{-2}$ and p-contact area of 200×500 um, an invention with a nanostructure 5 dimension of 200 nm width, 400 nm pitch P (FIG. 7), lateral overgrowth thickness OG (FIG. 6) of 50 nm and a second p-type region 6 layer thickness of 200 nm, a contact area of $2.76 \times 10^{-3} \Omega cm^2$ is obtained for the invention structure, but is only $1.0 \times 10^{-3} \Omega cm^2$ in the case of a conventional planar structure. This translates to a voltage drop of only 0.13 V at 60 mA operation, compared to 0.36 V for a conventional structure. This calculation is only an example, and any combination of second p-type region 6 thickness and lateral overgrowth thickness OG can be used, together with various designs and pitches P of the nanostructure 5 layout.

In FIG. 8F, the presence of the nanostructure 5 also prevents the metal electrode 7 in area 7b to diffuse into the active region 3, due to its close proximity. This will help in LED reliability issues, since these devices are generally rated to last at least 30,000 hours and gradual metal electrode diffusion into the active region over time can be an issue.

Embodiment 2

Figure 9A:
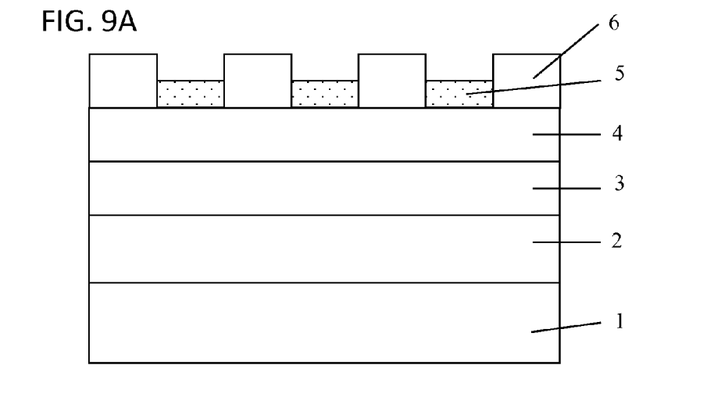
FIGS. 9A to 9B are schematic diagrams of an LED device according to Embodiment 2 of the invention.

According to this embodiment, the general structure in FIG. 6 can be modified to the structure shown in FIG. 9A. For this structure, the second p-type region 6 is regrown without any lateral overgrowth. This can be achieved, as an example by using molecular beam epitaxy growth for the second p-type region 6, whereby crystalline material will be grown on areas in contact with the first p-type region 4, and amorphous material grown on areas in contact with the silicon oxide nanostructures 5. The amorphous material can then be easily removed by immersing the sample in dilute potassium hydroxide solution, leaving the final structure as depicted in FIG. 9A. P-contact electrode 7 is then deposited on the sample and increased contact area is obtained through sidewall contact areas 7a.

Embodiment 3

Figure 9B:
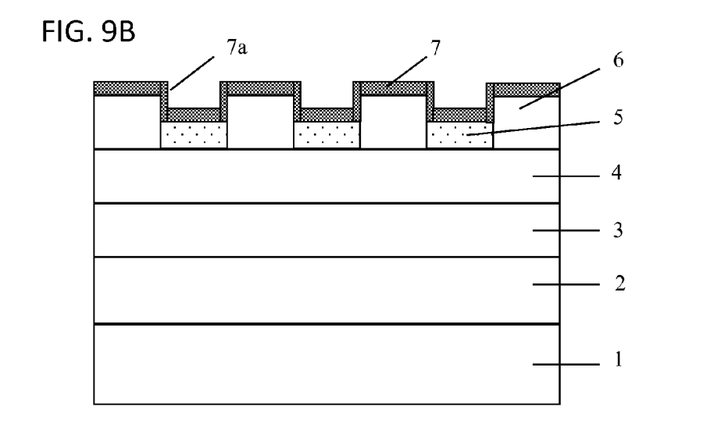
Figure 10A:
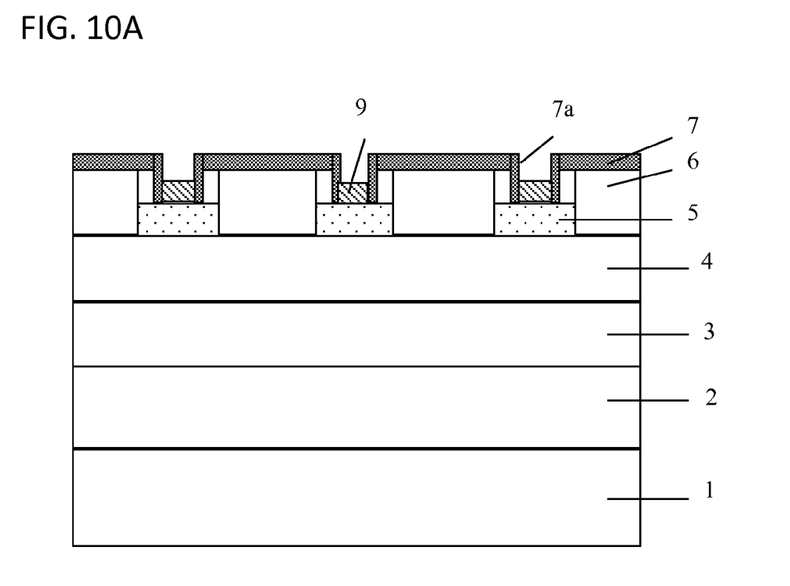
FIGS. 10A and 10B are schematic diagrams of an LED device according to Embodiment 3 of the invention.
Figure 10B:
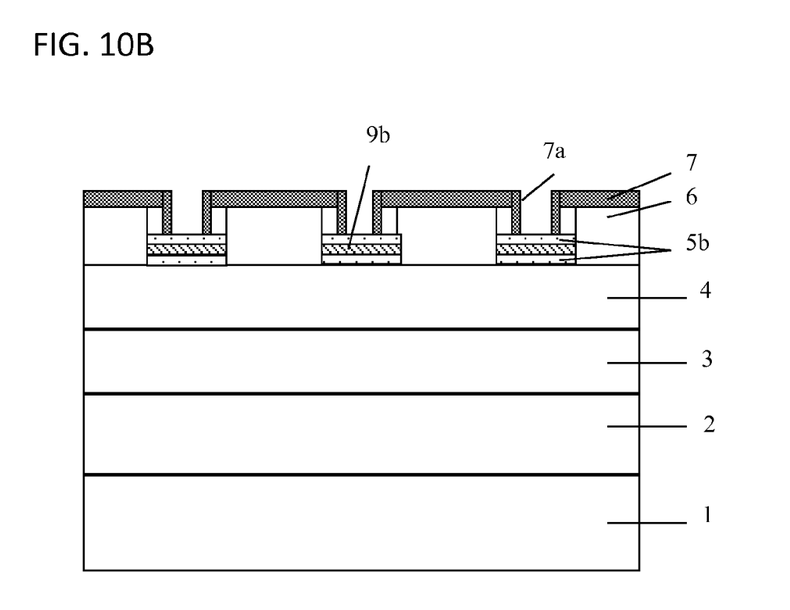

According to Embodiment 3 of the invention, the structures in FIG. 6 and/or FIG. 9B can be modified to the structure shown in FIG. 10A to take advantage of plasmonic effects to improve light extraction (see for eg. Kao et. al, *IEE Photonics Technology Letters*, vol. 22, No. 13, Jul. 1, 2010). For plasmonic effects to take place, a metallic layer, typically Ag, Au or Al is placed as close as possible to the active region. No current also should conduct between the metallic layer and semiconductor directly beneath, hence a thin oxide layer is usually placed in between. In FIG. 10A, a metallic layer 9 is placed directly above the oxide layer forming the nanostructures 5, as means to achieve plasmonic effects. Accordingly, the nanostructure oxide layer can be thinned down by means of wet or dry etching in order to position the metallic layer Ag, Au and Al closer to the active region. The LED structure can also be configured such that a plasmonic metal layer 9b is sandwiched between two oxide layers 5b forming the nanostructures 5, as shown in FIG. 10B.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

INDUSTRIAL APPLICABILITY

The invention thereby provides an LED device with nanostructures and a regrown p-type region to obtain both good light extraction efficiency and increased contact area to improve p-electrode ohmic contact resistance. The invention further provides a method of producing the structure.

The invention claimed is:

1. A light emitting diode (LED), comprising:
   a conductive n-type region formed on a substrate;
   an active region formed on the n-type region;
   a first p-type region formed on the active region;
   a plurality of nanostructures formed on the first p-type region to carry out light extraction from the active region, the nanostructures having a diameter less than 500 nm;
   a second p-type region regrown on the first p-type region to form a non-planar surface in combination with the nanostructures; and
   a p-type electrode formed on the non-planar surface.

2. The LED according to claim 1, wherein the second p-type region includes raised sidewalls adjacent the nanostructures.

3. The LED according to claim 2, wherein the sidewalls include lateral overgrowth regions extending partially across an upper surface of the nanostructures.

4. The LED according to claim 1, wherein a shape of the nanostructures is at least one of a square, circle, triangle or combination thereof.

5. The LED according to claim 1, further comprising a metallic layer formed above each of the nanostructures to achieve plasmonic effects.

6. The LED according to claim 1, wherein the nanostructures have a diameter less than 400 nm.

7. The LED according to claim 1, wherein the nanostructures have a diameter less than 300 nm.

8. The LED according to claim 1, wherein the first p-type region has a thickness between 10 nm and 80 nm.

9. The LED according to claim 1, wherein the nanostructures have a height between 10 nm and 100 nm.

10. The LED according to claim 1, wherein the nanostructures are formed of dielectric material.

11. The LED according to claim 10, wherein the dielectric material is any one or more of $SiO_2$, $SiN_x$, $TiO_2$, ZnO, MgO, ScO and SrF.

12. The LED according to claim 1, wherein the p-type electrode is made of indium tin oxide.

13. The LED according to claim 1, wherein the p-type electrode is formed of one or more of Ni, Ti, Au, Ag, Pt, Hf, Pd, and Al.

14. The LED according to claim 5, wherein the metallic layer is made of one or more of Ag, Au and Al.

15. The LED according to claim 5, wherein the metallic layer is sandwiched between two layers forming each nanostructure.

16. A method of making a light emitting diode (LED), comprising:
   forming a conductive n-type region on a substrate;
   forming an active region on the n-type region;
   forming a first p-type region on the active region;
   forming a plurality of nanostructures on the first p-type region to carry out light extraction from the active region, the nanostructures having a diameter less than 500 nm;
   regrowing a second p-type region on the first p-type region to form a non-planar surface in combination with the nanostructures; and
   forming a p-type electrode on the non-planar surface.

17. The method according to claim 16, wherein the nanostructures are patterned on the first p-type region.

18. The method according to claim 16, wherein the second p-type region is regrown using metal organic chemical vapour deposition (MOCVD).

19. The method according to claim 18, wherein the MOCVD includes the use of epitaxial lateral overgrowth technique (ELOG) to provide lateral overgrowth extending partially across an upper surface of the nanostructures.

20. The method according to claim 16, wherein the second p-type region is regrown using molecular beam epitaxy.

21. The method according to claim 16, further comprising forming a metallic layer above each of the nanostructures to achieve plasmonic effects.

22. The method according to claim 21, wherein the metallic layer is sandwiched between two layers forming each nanostructure.

* * * * *